US008774317B2

(12) United States Patent
Eliezer

(10) Patent No.: US 8,774,317 B2
(45) Date of Patent: *Jul. 8, 2014

(54) SYSTEM AND METHOD FOR PHASE MODULATION OVER A PULSE WIDTH MODULATED/AMPLITUDE MODULATED SIGNAL FOR USE IN A RADIO CONTROLLED CLOCK RECEIVER

(75) Inventor: Oren E. Eliezer, Plano, TX (US)

(73) Assignee: Everset Technologies, Inc., Bloomfield Hills, MI (US)

(*) Notice: Subject to any disclaimer, the term of this patent is extended or adjusted under 35 U.S.C. 154(b) by 0 days.

This patent is subject to a terminal disclaimer.

(21) Appl. No.: 13/422,601

(22) Filed: Mar. 16, 2012

(65) Prior Publication Data

US 2013/0121397 A1 May 16, 2013

Related U.S. Application Data

(60) Provisional application No. 61/559,966, filed on Nov. 15, 2011.

(51) Int. Cl.
*H03C 3/00* (2006.01)

(52) U.S. Cl.
USPC ............. 375/302; 375/269; 375/316; 455/42; 455/205; 455/108; 332/109; 332/103; 332/145; 370/205; 370/212

(58) Field of Classification Search
USPC ............ 375/302, 269, 316; 455/42, 205, 108; 332/103, 109, 145; 370/205, 212
See application file for complete search history.

(56) References Cited

U.S. PATENT DOCUMENTS

| | | | |
|---|---|---|---|
| 3,406,343 | A | 10/1968 | Mehlman |
| 3,648,173 | A | 3/1972 | Elliott |
| 4,117,661 | A | 10/1978 | Bryant, Jr. |
| 4,217,467 | A | 8/1980 | Kobayashi et al. |
| 4,500,985 | A | 2/1985 | Chang |
| 4,525,685 | A | 6/1985 | Hesselberth et al. |
| 4,562,424 | A | 12/1985 | Takagi et al. |
| 4,768,178 | A | 8/1988 | Conklin et al. |

(Continued)

OTHER PUBLICATIONS

Hetzel, P., Time Dissemination via the LF Transmitter DCF77 using a Pseudo-Random Phase-Shift Keying of the Carrier, 2nd EP Freq & Time Forum, Session TF-05, No. 3, Mar. 16, 1988.

(Continued)

*Primary Examiner* — Leila Malek
(74) *Attorney, Agent, or Firm* — Woods Oviatt Gilman LLP; Howard Zaretsky, Esq.

(57) ABSTRACT

A system and method for a radio controlled clock receiver adapted to extract timing and time information from a phase modulated signal. The official time signal is broadcast from a central location using a modified modulation scheme, which adds phase modulation over the legacy amplitude modulation, such as the legacy WWVB pulse width modulated (PWM)/amplitude shift keying (ASK) modulation, thereby allowing for improved performance. The information modulated onto the phase contains a known synchronization sequence having good autocorrelation properties, error-correcting coding for the time information and notifications of daylight-saving-time (DST) transitions that are provided months in advance. The modulation scheme is based on a form of phase modulation, such as binary-phase-shift-keying (BPSK) or phase reversal keying (PRK). The reception of multiple frames with repeated or sequential information allows for the accumulation of received energy over multiple frames to provide for a corresponding gain in the receiver.

21 Claims, 12 Drawing Sheets

(56) References Cited

U.S. PATENT DOCUMENTS

| | | | |
|---|---|---|---|
| 4,925,299 A | 5/1990 | Meisberger et al. | |
| 5,805,647 A | 9/1998 | Schafer et al. | |
| 6,041,082 A | 3/2000 | Takeda et al. | |
| 6,124,960 A | 9/2000 | Garthe et al. | |
| 6,212,133 B1 | 4/2001 | McCoy et al. | |
| 6,295,442 B1 | 9/2001 | Camp, Jr. et al. | |
| 6,862,317 B1 | 3/2005 | Mohan et al. | |
| 6,937,668 B2 | 8/2005 | Sridharan et al. | |
| 7,027,773 B1 | 4/2006 | McMillin | |
| 7,215,600 B1 | 5/2007 | DeRosa | |
| 7,324,615 B2 | 1/2008 | Lourens et al. | |
| 7,411,870 B2 | 8/2008 | Murata et al. | |
| 7,636,397 B2 | 12/2009 | McLaughlin | |
| 7,719,928 B2 | 5/2010 | Meltzer et al. | |
| 7,720,452 B2 | 5/2010 | Miyahara et al. | |
| 7,738,322 B2 | 6/2010 | Murata et al. | |
| 7,750,612 B2 | 7/2010 | Yokosawa | |
| 7,956,778 B2 | 6/2011 | Koyama | |
| 7,974,580 B2 | 7/2011 | Fagg | |
| 8,300,687 B1 | 10/2012 | Eliezer | |
| 2003/0169641 A1 | 9/2003 | O'Neill et al. | |
| 2004/0196926 A1 | 10/2004 | Chien et al. | |
| 2004/0239415 A1 | 12/2004 | Bishop | |
| 2005/0036514 A1 | 2/2005 | Polonio et al. | |
| 2005/0073911 A1 | 4/2005 | Barnett | |
| 2005/0105399 A1 | 5/2005 | Strumpf et al. | |
| 2005/0111530 A1 | 5/2005 | Chen et al. | |
| 2005/0141648 A1 | 6/2005 | Lourens et al. | |
| 2005/0169230 A1 | 8/2005 | Haefner | |
| 2005/0175039 A1 | 8/2005 | Haefner et al. | |
| 2005/0213433 A1 | 9/2005 | Mah | |
| 2006/0140282 A1 | 6/2006 | Kondo | |
| 2007/0089022 A1* | 4/2007 | McLaughlin | 714/755 |
| 2007/0115759 A1 | 5/2007 | Sano | |
| 2007/0140064 A1 | 6/2007 | Fujisawa | |
| 2007/0164903 A1 | 7/2007 | Takada | |
| 2008/0049558 A1 | 2/2008 | Shimizu | |
| 2008/0095290 A1 | 4/2008 | Leung | |
| 2008/0107210 A1 | 5/2008 | Haefner | |
| 2008/0239879 A1 | 10/2008 | Someya | |
| 2009/0016171 A1 | 1/2009 | Fujisawa | |
| 2009/0054075 A1 | 2/2009 | Boejer et al. | |
| 2009/0122927 A1 | 5/2009 | Walton et al. | |
| 2009/0254572 A1 | 10/2009 | Redlich et al. | |
| 2009/0274011 A1 | 11/2009 | Fujisawa | |
| 2011/0051561 A1 | 3/2011 | Fujisawa | |
| 2011/0084777 A1 | 4/2011 | Wilhelm | |
| 2011/0129099 A1 | 6/2011 | Fagg | |
| 2012/0082008 A1* | 4/2012 | Eliezer et al. | 368/47 |

OTHER PUBLICATIONS

Lombardi, Michael A., NIST Time and Frequency Services, NIST Special Publication 432, Jan. 2002 Edition.

Lombardi, Michael A. et al., WWVB Radio Controlled Clocks: Recommended Practices, Special Publication 960-14, 2009 Edition.

Lowe, John, We Help Move Time Through the Air, RadioWorld, vol. 35, No. 8, Mar. 23, 2011.

Tele Distribution Francaise, http://en.wikipedia.org/Tele_Distribution_Francaise.

DCF77, http:/en.wikipedia.org/wiki/DCF77#Phase_modulation.

WWVB, http://en.wikipedia.org/wiki/WWVB.

US Dept of Commerce, NIST, FY 2010 Small Business Innovation Research Program Solicitation, NIST-10-SBIR, Oct. 30, 2009-Jan. 22, 2010.

Allen, K.C., Analysis of Use of 10 or 20 dB Amplitude Shifting for WWVB at 60 kHz, National Telecommunication & Information Administration, Apr. 25, 2005.

Deutch, Matthew et al., WWVB Improvements: New Power from an Old Timer, 31st Annual Precise Time and Time Interval (PTTI) Meeting, Dec. 7-9, 1999.

Piester, D. et al., PTB's Time and Frequency Activities in 2006: New DCF77 Electronics, New NTP Servers, and Calibration Activities, Proc. 38th Annual PTTI Mtg, Dec. 5-7, 2006.

Bauch, A. et al., PTBM, Special Topic—50 Years of Time Dissemination with DCF77, Special Issue, vol. 119 (2009), No. 3.

Lombardi, Michael A., Radio Controlled Clocks, NIST Time and Frequency Division, NCSL International Workshop and Symposium, 2003.

Chen, Yin et al., Ultra-Low Power Time Synchronization Using Passive Radio Receivers, IPSN '11, Apr. 12-14, 2011.

Lowe, J. et al., Increasing the Modulation Depth of the WWVB Time Code to Improve the Performance of Radio Controlled Clocks, Int'l Freq Control Symp & Expo, IEEE, Jun. 2006.

Lichtenecker, R. "Terrestrial time signal dissemination", Real-Time Systems, 12, pp. 41-61, Kluwer Academic Publishers, Boston MA, 1997.

Cherenkov, G.T. "Employment of phase modulation to transmit standard signals", Plenum Publishing Corporation, 1984.

PCT International Search Report and Written Opinion, PCT/US2012/049029, Dec. 26, 2012.

* cited by examiner

SYSTEM AND METHOD FOR PHASE MODULATION OVER A PULSE WIDTH MODULATED/AMPLITUDE MODULATED SIGNAL FOR USE IN A RADIO CONTROLLED CLOCK RECEIVER

REFERENCE TO PRIORITY APPLICATION

This application claims priority to U.S. Provisional Application Ser. No. 61/559,966, filed Nov. 15, 2011, entitled "Reception of Time Information and Synchronization Information in a Radio Controlled Clock," incorporated herein by reference in its entirety.

FIELD OF THE INVENTION

The present invention relates to the field of wireless communications, and more particularly relates to a radio controlled clock receiver adapted to extract timing and time information from a phase modulated signal transmitted over a pulse width modulated/amplitude modulated signal.

BACKGROUND OF THE INVENTION

Radio-controlled-clock (RCC) devices that rely on time signal broadcasts have become widely used in recent years. A radio-controlled-clock (RCC) is a timekeeping device that provides the user with accurate timing information that is derived from a received signal, which is broadcast from a central location, to allow multiple users to be aligned or synchronized in time. Colloquially, these are often referred to as "atomic clocks" due to the nature of the source used to derive the timing at the broadcasting side. In the United States, the National Institute of Standards and Technology (NIST) provides such broadcast in the form of a low-frequency (60 kHz) digitally-modulated signal that is transmitted at high power from radio station WWVB in Fort Collins, Colo. The information encoded in this broadcast includes the official time of the United States. This also includes information regarding the timing of the implementation of daylight saving time (DST), which has changed in the United States over the years due to various considerations.

Reception of the time signal, however, is being challenged by a growing number of sources of electromagnetic interference. In particular, the on-frequency interference from the MSF radio station in the United Kingdom has been identified as a particularly challenging jammer for receivers on the East Coast.

This created a need for a new protocol for time signal broadcasts, representing an upgrade to that provided by WWVB that attempts to cost-effectively address the reception challenges. The new protocol should preserve amplitude modulation properties of the legacy time-code broadcast, in order to maintain backwards compatibility and not impact legacy devices, the operation of which should not be affected by the additional features offered by an enhanced protocol.

SUMMARY OF THE INVENTION

The present invention is a system and method for a radio controlled clock receiver adapted to extract timing and time information from a phase modulated signal that, in one embodiment, is transmitted over a pulse-width modulation/amplitude-modulated signal. The system and method of the present invention provide a modified modulation scheme for transmission of the official time signal that is broadcast from a central location, and a receiver adapted to extract the timing and time information from this broadcast. The modified modulation scheme adds phase modulation that allows for greatly improved performance. In one embodiment, the information modulated onto the phase contains a known synchronization sequence, error-correcting coding for the time information and notifications of daylight-saving-time (DST) transitions that are provided months in advance.

The structure and method of operation of the receiver allow the timekeeping functionality of a device to be accurate, reliable and power efficient. The communication protocol of the present invention is adapted to allow prior-art devices to operate in accordance with the legacy communication protocol such that they are unaffected by the changes introduced to the protocol by the present invention, whereas devices adapted to operate in accordance with the present invention benefit from various performance advantages. These advantages include (1) greater robustness of the communication link in the presence of impulse noise and on-frequency jamming; (2) more reliable operation at a much lower signal-to-noise-and-interference-ratio (SNIR); (3) greater reliability in providing the correct time; and (4) reduced energy consumption which leads to extended battery life in battery-operated devices.

In one embodiment of the present invention, the additional modulation applied to the carrier is limited to its phase, thereby allowing existing devices that operate in accordance with the legacy communication protocol, whereby the information may be extracted through envelope detection, to continue to operate with the modified protocol without being affected. Although this backward compatibility property of the communication protocol of the present invention may represent a practical need when upgrading an existing system, the scope of the invention is not limited to the use of this modulation scheme and to operation in conjunction with an existing communication protocol.

The enhanced robustness offered by the present invention, resulting in reliable reception at lower SNIR values with respect to those required for proper operation of prior art devices, is a result of the use of (1) a known synchronization sequence having good autocorrelation properties; (2) coding that allows for error detection and correction within the fields of information bits that are part of each data frame; and (3) the use of a superior modulation scheme, such as binary-phase-shift-keying (BPSK) (also known as phase-reversal keying or PRK) in one embodiment of the present invention. The PRK modulation, representing an antipodal system, provides the largest distance in the signal space with respect to signal power, whereas the historical modulation schemes that are used for time broadcasting worldwide are based on pulse width modulation (PWM) that relies on amplitude demodulation, requiring a higher SNIR to achieve the same decision error probability or bit-error-rate (BER).

The enhanced reliability in assuming or setting the right time in a device of the present invention may be partly achieved through the use of a time-computing procedure that considers not only the information extracted from the received frame, but also the time that has been assumed in the timekeeping device. For example, if the information extracted from a received frame suggests that the year is many years ahead of what the timekeeping device has been assuming for a long time, it is likely that the reception is in error and should be disregarded.

On a finer scale, when the correlation operation that makes use of the known synchronization sequence in the received signal produces a noisy result (i.e. the correlation peak is closer to the low-correlation results), based on which the timing extraction may be inaccurate, the receiver may apply averaging filtering, wherein the timing extracted from the received signal is weighted against the locally assumed time in the device such that the timing adjustment considers them both instead of being determined based solely on the received signal, as is typically done in existing prior art devices.

Furthermore, the system is scalable in that it allows for receivers experiencing different reception conditions to use the received signal differently. In particular, it is designed to allow for the accumulation of received energy over multiple one-minute frames (i.e. throughout a one-hour superframe or a portion thereof), to provide for a corresponding gain in the receiver (e.g., reception for a whole hour may provide a gain of 60, or 18 dB, with respect to a single minute).

The features described supra serve to greatly increase the robustness and reliability of the time signal communication system, allowing it to operate at signal-to-noise ratios that are several orders of magnitude lower than those required in the existing scheme, while exhibiting even higher gains in scenarios of on-frequency jamming, to which the existing receivers are particularly vulnerable.

There is thus provided in accordance with the invention, a radio receiver method, the method comprising receiving a broadcast signal comprising phase modulation (PM) over a legacy amplitude modulated (AM) signal, the broadcast signal encoded with time information and extracting the time information from the phase of the received signal.

There is also provided in accordance with the invention, a radio receiver comprising a receiver circuit operative to receive a broadcast signal comprising phase modulation (PM) over a legacy amplitude modulated (AM) signal, the broadcast signal encoded with time information and a circuit operative to extract the time information from the phase modulated portion of the received signal.

There is further provided in accordance with the invention, a radio receiver method, the method comprising receiving a phase modulated (PM) broadcast signal encoded with time information, wherein the phase modulation is applied over a legacy pulse-width modulated (PWM)/amplitude modulation (AM) signal and extracting the time information from the phase modulation of the received signal.

There is also provided in accordance with the invention, a radio receiver comprising a receiver circuit operative to receive a phase modulated (PM) broadcast signal encoded with time information, wherein the phase modulation is applied over a legacy pulse-width modulated (PWM)/amplitude modulation (AM) signal and a circuit operative to extract the time information from the phase modulated portion of the received signal.

BRIEF DESCRIPTION OF THE DRAWINGS

The invention is herein described, by way of example only, with reference to the accompanying drawings, wherein.

DETAILED DESCRIPTION OF THE INVENTION

Figure 1:
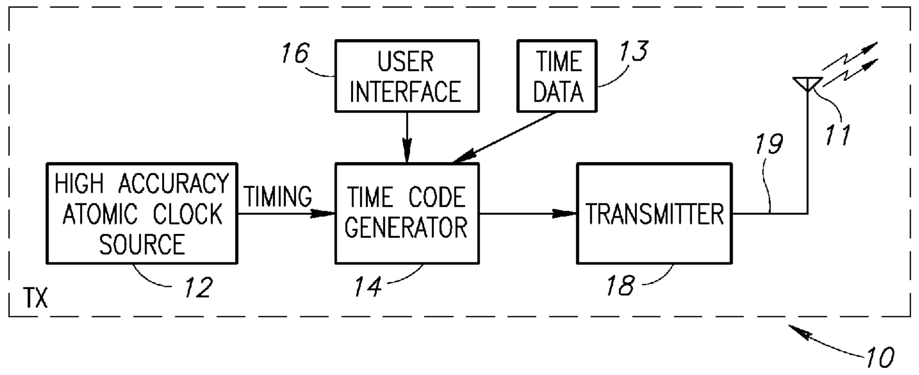
FIG. 1 is a high level block diagram illustrating an example timing and time information transmitter of a system operating in accordance with the present invention.

A high level block diagram illustrating an example timing and time information transmitter system operating in accordance with the present invention is shown in FIG. 1. The equipment at the transmitter end, generally referenced 10, comprises a high accuracy clock source (frequency source) 12 from which a clock signal (timing information) is derived, a time-code-generator 14 having user-interface 16, a source of time data 13, a transmitter 18 generating a TX signal 19 and coupled to transmitting antenna 11.

The time code generator 14 keeps track of time based on the high-accuracy frequency source input to it from source 12, constructs the frames of data representing the time information received from time data source 13 and other information that is to be transmitted, modulates the data frames onto the RF carrier in accordance to a protocol and allows time initialization and other controls to be set in it through its user interface 16. The transmitter 18 amplifies the modulated signal to generate an output TX signal 19 at the desired levels, e.g., 50 kW, and drives the antenna 11 that is used for the wide-coverage omnidirectional broadcasting of the signal.

Figure 2:
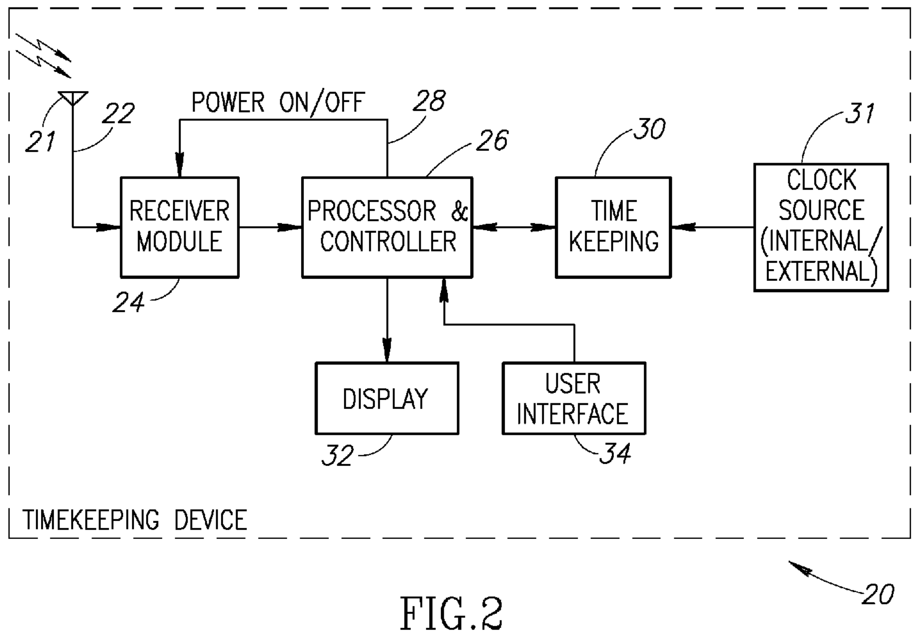
FIG. 2 is a high level block diagram illustrating an example timing and time information receiver constructed in accordance with the present invention.

A high level block diagram illustrating an example timekeeping device constructed in accordance with the present invention is shown in FIG. 2. Typically, the timekeeping device is incorporated into low cost consumer market products, but may be implemented in any device that requires a precision time reference. The timekeeping device, generally referenced 20, comprises receiving antenna 21, receiver module 24 operative to receive RX signal 22, processor and controller 26, timekeeping function 30, internal or external clock source 31, display 32 and user interface 34.

The receiver module 24 extracts timing and time information from the received signal 22, in accordance with the modulation scheme and protocol in use, and provides the processing and control function 26 with the extracted timing and time information. Controller function/processor 26 appropriately enables/disables the operation of the receiver module through control line 28 such that it is limited to the intervals of interest to minimize energy consumption in those applications where it may be critical to do so (e.g., wrist watches). The timekeeping function 30 keeps track of the time based on pulses provided by clock source 31 having limited accuracy. Note that the clock source 31 may comprise any suitable clock source or clock signal such as a crystal oscillator and may be provided internal to the timekeeping device 20 or supplied from a source external to the timekeeping device.

The timekeeping may be adjusted by the processor/controller in accordance with an estimated drift at a specific instant, which is either measured or calculated or a combination of the two. The display function 32 may be used to display the time as well as various indications to the user, including reception quality, estimated bound for error in displayed time, battery status, etc. The user interface function 34, based on pushbuttons, slide-switches, a touch-screen, keypad, computer interface, a combination therefrom, or any other form of human interface, may be used to set the initial time, define the maximal allowed timing error, the time-zone according to which time is to be calculated, the use of daylight saving time, etc.

In one embodiment of the invention, the timekeeping device is operative to extract timing and time information conveyed in a broadcast signal. Timing information denotes information related to synchronization and tracking and is used, for bit and frame synchronization, as well as for fine adjustment of the time-keeping device's time (e.g., sub one-second accuracy). Time information denotes information related to the current time being communicated, such as the date and the time of day (hours, minutes, etc.), as well as scheduled events, such as an upcoming DST transition, leap second, etc.

Typical available time-broadcast signals employ some form of amplitude modulation combined with some form of pulse width modulation (PWM) to send binary data bits. As an example consider the legacy WWVB signal broadcast from Fort Collins, Colo. in the United States of America. The WWVB signal comprises a 60 second frame consisting of 60 one second bits. Each bit, of one second duration, is sent as a pulse-width modulated signal wherein the carrier is transmitted at a low amplitude or a high amplitude for different portions of the bit. The frame also consists of several marker bits spread out evenly through the frame, which serve only to indicate timing and do not convey time information. Representations of the different possible signal waveforms transmitted by WWVB are presented below.

Figure 3:
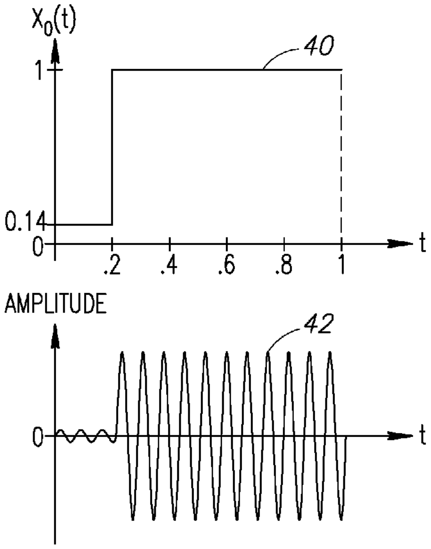
FIG.3 (PRIOR ART)
FIG. 3 is a diagram illustrating a first example pulse-width modulated AM signal representing a '0' bit.
Figure 4:
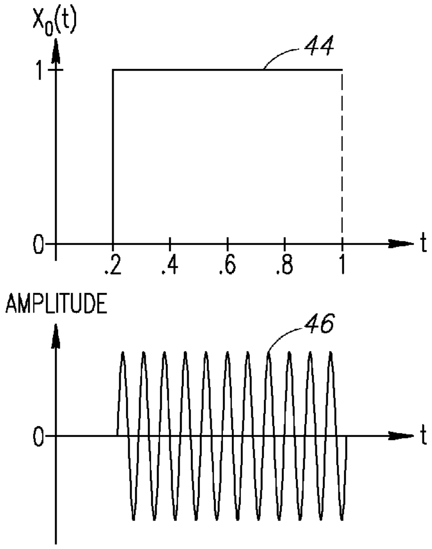
FIG.4 (PRIOR ART)
FIG. 4 is a diagram illustrating a second example pulse-width modulated AM signal representing a '0' bit.
Figure 5:
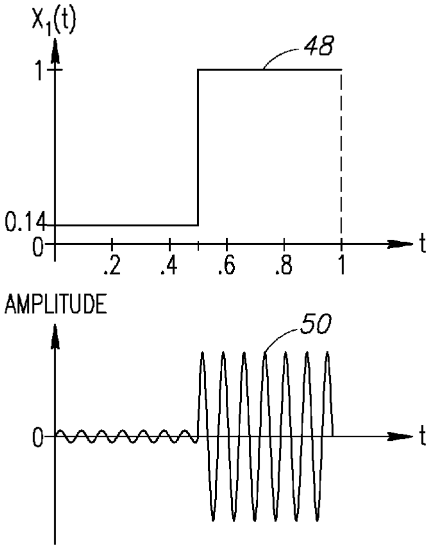
FIG.5 (PRIOR ART)
FIG. 5 is a diagram illustrating a first example pulse-width modulated AM signal representing a '1' bit.
Figure 6:
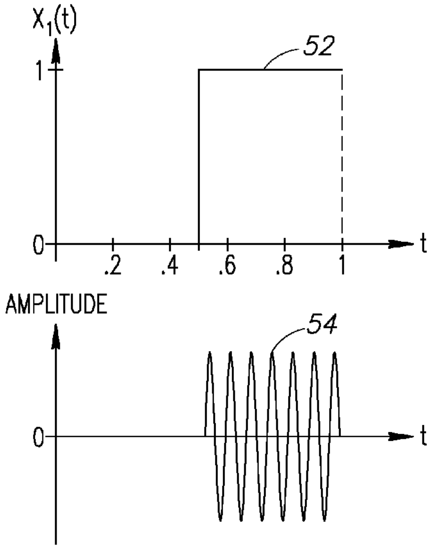
FIG.6 (PRIOR ART)
FIG. 6 is a diagram illustrating a second example pulse-width modulated AM signal representing a '1' bit.
Figure 7:
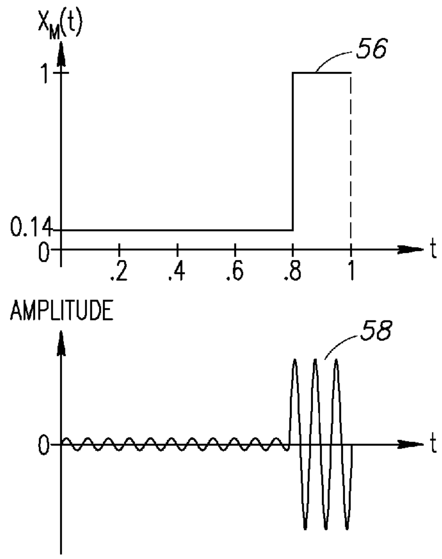
FIG.7 (PRIOR ART)
FIG. 7 is a diagram illustrating a first example pulse-width modulated AM signal representing a marker 'M'.
Figure 8:
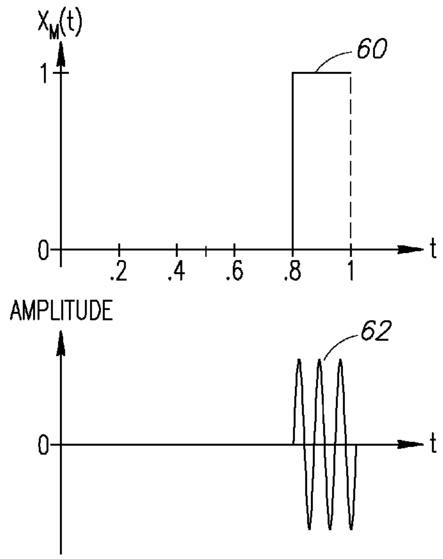
FIG.8 (PRIOR ART)
FIG. 8 is a diagram illustrating a second example pulse width modulated AM signal representing a marker 'M'.

The existing WWVB system transmits a pulse-width modulated amplitude-shift keyed waveform on a 60 kHz carrier. The one-second duration '0' and '1' symbols are represented by a power reduction of −17 dB at the start of the second for 0.2 s and 0.5 s, respectively. FIGS. 3, 5, 7 show the baseband waveforms for the '0' (denoted $x_0(t)$), '1' (denoted $x_1(t)$) and Marker ('M') symbols for the legacy WWVB system, where the low portion of the symbols are reduced in power −17 dB, corresponding to an amplitude reduction to about 0.14 of the high amplitude. FIGS. 4, 6, 8 show the baseband waveforms for the '0' (denoted $x_0(t)$), '1' (denoted $x_1(t)$) and Marker ('M') symbols for an example broadcast system where the low portion of the symbols are zero amplitude.

A diagram illustrating a first example pulse width modulated AM signal representing a '0' bit is shown in FIG. 3. The signal $x_0(t)$ 40 (upper diagram) represents the envelope or baseband waveform of a '0' bit and consists of 0.2 seconds of low amplitude carrier (e.g., 0.14 amplitude) and 0.8 seconds of high amplitude carrier. The lower diagram shows the corresponding carrier waveform 42 of 0.2 seconds low amplitude followed by 0.8 seconds of high amplitude.

A diagram illustrating a second example pulse width modulated AM signal representing a '0' bit is shown in FIG. 4. The signal $x_0(t)$ 44 (upper diagram) represents the envelope or baseband waveform of a '0' bit and consists of 0.2 seconds of zero amplitude carrier and 0.8 seconds of high amplitude carrier. The lower diagram shows the corresponding carrier waveform 46 of 0.2 seconds zero amplitude followed by 0.8 seconds of high amplitude.

A diagram illustrating a first example pulse width modulated AM signal representing a '1' bit is shown in FIG. 5. The signal $x_1(t)$ 48 (upper diagram) represents the envelope or baseband waveform of a '1' bit and consists of 0.5 seconds of low amplitude carrier (e.g., 0.14 amplitude) and 0.5 seconds of high amplitude carrier. The lower diagram shows the corresponding carrier waveform 50 of 0.5 seconds low amplitude followed by 0.5 seconds of high amplitude.

A diagram illustrating a second example pulse width modulated AM signal representing a '1' bit is shown in FIG. 6. The signal $x_1(t)$ 52 (upper diagram) represents the envelope or baseband waveform of a '1' bit and consists of 0.5 seconds of zero amplitude carrier and 0.5 seconds of high amplitude carrier. The lower diagram shows the corresponding carrier waveform 54 of 0.5 seconds zero amplitude followed by 0.5 seconds of high amplitude.

A diagram illustrating a first example pulse width modulated AM signal representing a marker 'M' bit is shown in FIG. 7. The signal $x_1(t)$ 56 (upper diagram) represents the envelope or baseband waveform of a 'M' bit and consists of 0.8 seconds of low amplitude carrier (e.g., 0.14 amplitude) and 0.2 seconds of high amplitude carrier. The lower diagram shows the corresponding carrier waveform 58 of 0.8 seconds low amplitude followed by 0.2 seconds of high amplitude.

A diagram illustrating a second example pulse width modulated AM signal representing a marker 'M' bit is shown in FIG. 8. The signal $x_1(t)$ 60 (upper diagram) represents the envelope or baseband waveform of a 'M' bit and consists of 0.8 seconds of zero amplitude carrier and 0.2 seconds of high amplitude carrier. The lower diagram shows the corresponding carrier waveform 62 of 0.8 seconds zero amplitude followed by 0.2 seconds of high amplitude.

Figure 9:
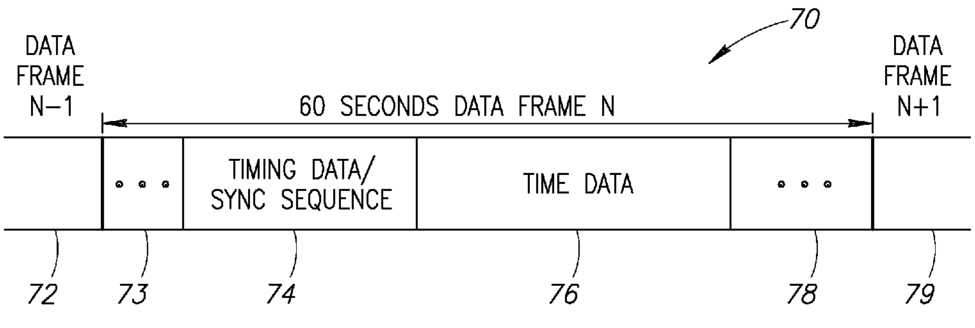
FIG. 9 is a diagram illustrating the structure of an example data frame incorporating timing and time information.

A diagram illustrating the structure of an example data frame incorporating timing and time information in an example communication protocol is shown in FIG. 9. The frame N, generally referenced 70, comprises timing data 74, time data 76 and a field of zero or more additional information bits 78. The $N^{th}$ transmitted frame is preceded by frame N−1 72 and followed by frame N+1 79, both of which span 60 seconds and represent the minute before and the minute after frame N, respectively.

In one embodiment, the transmitted frame 70 comprises a synchronization sequence 74 spanning m seconds, a field of information 73 spanning k seconds that precedes the synchronization sequence and a field 78 spanning the remaining time 60−(m+k) seconds following the synchronization sequence, such that the four fields together span the total of 60 seconds. The values of m and k are preferably fixed and their sum is less than 60, such that the location of the synchronization sequence is predictable in a frame, allowing the receiver to search for it at the expected timing, while ignoring the information bits if there is no need to receive them.

The timing data field 74 comprises a known synchronization sequence (e.g., barker code, modified barker code, pseudo random sequence, or any other known word or bit/symbol sequence) at a known timing within the one minute frame of 60 bits that is transmitted every 60 seconds. Note that in alternative embodiments the synchronization sequence may be placed within the frame such that it overlaps or straddles the frame N−1 before it or frame N+1 after it.

Figure 10:
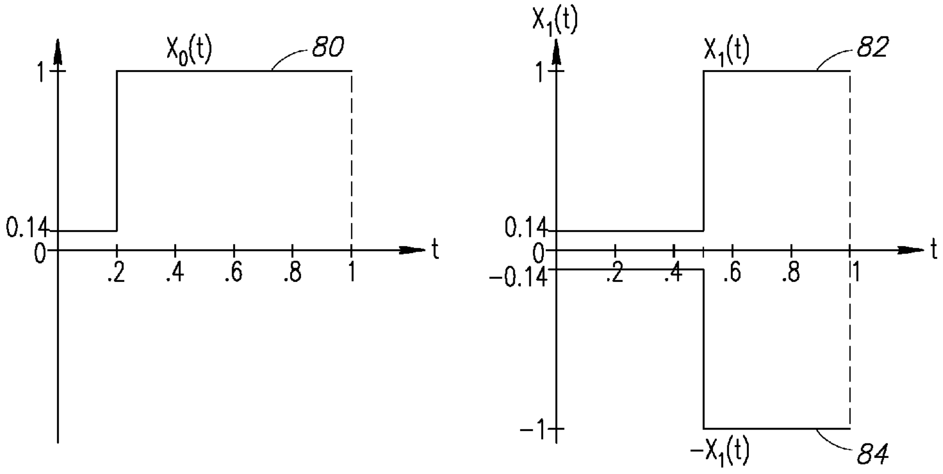
FIG. 10 is a diagram illustrating an example embodiment of phase modulation, shown at baseband, added to a pulse-width amplitude modulated carrier.

In one embodiment of the invention, phase modulation is added to an amplitude modulated carrier. A diagram illustrating phase modulation added to an amplitude modulated carrier in an example communication protocol is shown in FIG. 10. This diagram describes the amplitude/pulse width modulation (PWM) used in the historical WWVB broadcast as well as the phase modulation introduced in accordance with an embodiment of the present invention. The diagram shows the baseband representation of the '0' and '1' symbols in both the historical WWVB modulation and in one that is modified in accordance with an example embodiment of the present invention. It is noted that the enhancement in the communication protocol offered by the present invention, in the form of independently defined phase modulation and the use of a known synchronization sequence, is not limited to the broadcast of WWVB and may be applied to other timing/time information broadcast systems such as those in other countries around the world where similar AM/pulse-width schemes are used or where no AM/pulse-width modulation needs to be supported, allowing for continuous BPSK to be used.

In one embodiment, the additional phase modulation added to the signal is binary phase shift keying (BPSK) having an 180° difference in the carrier's phase between the '0' and '1' symbols, also known as antipodal phase modulation or Phase Reversal Keying (PRK). Hence, the modulated waveforms representing these symbols may be expressed as the products of the sinusoidal 60 kHz carrier (in the case of WWVB) and the baseband waveforms $s_0(t)=x_0(t)$ (waveform 80) and $s_1(t)=-x_1(t)$ (waveform 84), respectively, as shown in FIG. 10. Waveform 82 represents the original '1' symbol $s_1(t)=x_1(t)$ that is replaced by its inverse waveform 84 in one example embodiment of the present invention. As is shown in FIG. 10, the enhanced modulation scheme can be accomplished through simple sign inversion for the waveform representing the '1' symbol. It is noted that since the existing envelope detector based receivers, designed to receive and decode the current WWVB AM/PWM based broadcast signal, do not consider the carrier's phase, they are not impacted by the modification of phase inversion of the '1' symbol.

Figure 11:
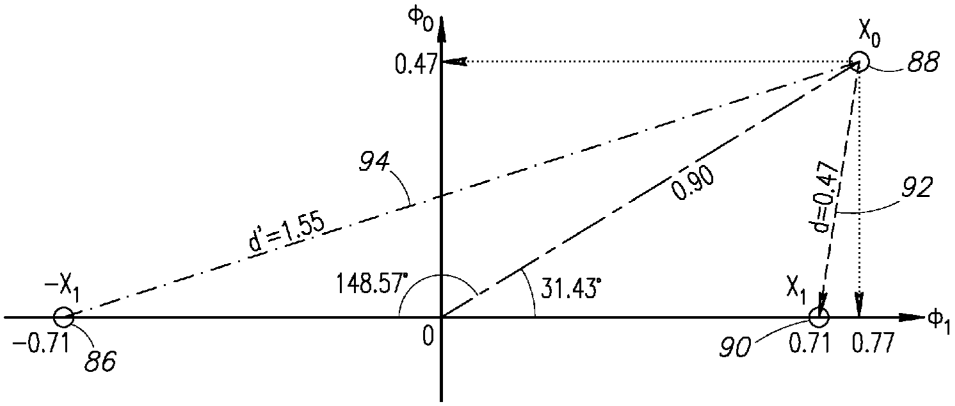
FIG. 11 is a diagram illustrating the signal space representation of the prior art AM/pulse-width '0' and '1' signals, as well as that of the an example embodiment of the present invention, where PRK is added onto the AM/pulse-width modulation.

A diagram illustrating the signal space representation of AM only and PM over AM '0' and '1' symbols is shown in FIG. 11. As shown in the diagram, the new pair of waveforms, $x_0$ (referenced 88) and $-x_1$ (referenced 86), having the same amount of energy (corresponding to their distances from origin), exhibit a much greater distance between the '0' and '1' symbols as compared to waveform pair $x_0$ and $x_1$ (referenced 90), thereby allowing for more robust reception in the presence of additive noise. Note that the existing symbols $x_0$ and $x_1$ are strongly correlated, i.e. they have a very short distance between them in the signal space with respect to their energies.

The Euclidean distance between the two amplitude modulated waveforms $x_0$ and $x_1$ is shown to be 0.47, whereas the Euclidean distance for the two phase modulated waveforms $x_0$ and $-x_1$ increases to 1.55. Therefore, the modulation gain (denoted $m_g$) representing the power ratio by which the detection capability in the presence of additive noise is improved, is given by $$\begin{aligned} m_g &= 20\log_{10}\left(\frac{1.55}{0.47}\right) \\ &= 10.36 \text{ db} \end{aligned} \tag{1}$$

Thus, by simply adding such phase modulation, an order of magnitude of improvement may be achieved when assuming additive white Gaussian noise (AWGN). This analysis implicitly assumes that the receivers for both schemes would be optimal, i.e. based on correlation or matched filtering. In practice, the BPSK receiver may be implemented digitally in a near-optimal fashion, whereas the receivers for the existing AM/pulse-width scheme, not designed as a classical digital-communications system, are based on envelope detection, as previously noted. This adds an additional gap of 2 to 4 dB between the two when only AWGN is considered. In the presence of on-frequency interference, however, the gain offered by realizing a near-optimal BPSK receiver may be arbitrarily higher. Furthermore, additional gains can be offered, such as (1) through encoding of the information, (2) use of a known synchronization sequence, and (3) extended-duration reception in the receiver over multiple frames (i.e. superframes).

In an embodiment of the present invention, the information represented by the phase modulation in each bit is independent from that represented by the existing (legacy) AM/pulse-width modulation, such that an inverted phase would not necessarily be tied to the shorter waveform 82, represented by inverted waveform $-x_1(t)$ 84 in FIG. 10. In an example embodiment, with independent data being communicated through the carrier's phase, a phase inverted bit, which may represent a "1", for example, may be combined with either a "0" or a "1" in the AM/PWM signal, resulting in the example waveform shown in FIG. 14A.

The receiver extracting the information from the phase may limit the phase demodulation operation to the last 0.5 sec of each bit, where both the "0" and "1" symbols of the AM/PWM scheme shown in this example are at high amplitude. Alternatively, in order to gain from the additional energy in the longer "0" pulses (0.8 sec in this example), the receiver may extend the demodulation of phase during those symbols to 0.8 sec when the content is of the AM/PWM modulation is known to be "0". In the existing WWVB protocol, for example, there are several such bits fixed at "0". Additionally, when a device operating in accordance with the present invention has already acquired the time and is tracking it, its reception of the phase modulated information may consider the predicted durations of the time-information bits as they are defined by the particular AM/PWM protocol, thereby further optimizing reception.

Furthermore, a receiver operating in accordance with the present invention may also consider some or all of the energy that a transmitted bit may have in the low amplitude portion of it, if it is greater than zero. This is to be done by weighting that portion of the signal in accordance with the theory of matched filtering, i.e. if the lower amplitude portion is at a normalized level of 0.14, the correlation operation in the receiver must provide it with such weighting with respect to the weighting of 1 that is applied during the high level duration in the receiver symbol.

In one embodiment, the receiver determines the current time in accordance with a nonlinear function that disregards the timing and time information extracted from the received frame (along with its weighting) if its distance from the local currently assumed time in the timekeeping device is greater than a predefined or dynamic threshold. This it to avoid incorrect timing adjustments that could be caused by erroneous reception of the timing or time information, the likelihood of which increases as the SINR conditions are more severe.

In one embodiment, a dynamically adaptive threshold considers the duration over which the time-keeping device has been maintaining the time and the statistics of the time corrections applied throughout that duration. For example, a time keeping device that has been tracking the time for an entire year, while performing weekly timing adjustments averaging 0.8 sec, with the greatest correction being below 1.5 seconds in magnitude, may act to disregard a reception instance suggesting a timing correction of 4 seconds, whereas it would have been considered and weighted at an earlier point in time during that year.

When the time-keeping device takes into account the timing information extracted by correlating the appropriate portion of the received signal against the known synchronization sequence, an example embodiment of the present invention may perform such an operation utilizing linear combining wherein the coefficient applied towards the timing extracted from the received signal and the coefficient applied for the locally assumed time depend on the levels of confidence in these two timings variables. If, for example, the reception conditions are determined to be excessively noisy, for which the probability of inaccurate timing extraction is higher, whereas the locally assumed time is based on a relatively recent adjustment and a good record of successive timing adjustments suggests that not much drift could have been experienced up until the instance of the reception at question, then relatively low weighting may be applied towards the received timing versus the locally assumed one. If, in contrast, the received timing is accompanied by an indication of high SINR, suggesting a high probability that it is accurate, then it may receive higher weighting compared to that of the locally assumed timing.

In one embodiment, a time-keeping device operating in accordance with the present invention applies non-linear logic in its reception of time information when a locally assumed time is available and has been validated over time. If the device attempts to extract from a received frame not only the timing information, for the purpose of timing adjustment, but also time information, despite such information already being available to it, then rather than computing a new time based on a linear combination of the received time and the locally assumed one, it is to select one of the two. If the locally assumed time has been validated over time and the received frame is received with errors or is accompanied by a low SINR indication, then the device may disregard the information extracted from the receiver. If, however, the device's confidence in its locally assumed time is low and the received signal is accompanied by an indication of reliable reception, then the received time may be selected, or one or more additional frames may be received to further increase the confidence in the received information.

In an alternative embodiment, non-antipodal phase modulation can be used to modulate the PWM signal. For example, the magnitude of phase modulation applied may be set at any value less than 180°, e.g., ±45°, ±25°, ±13°, etc. Use of a lower value such as ±13° ensures that the modulated signal is contained within a narrow bandwidth and does not escape the narrow filtering in typical existing AM receivers, which is on the order of 10 Hz. Note that such narrowband PM is not comparable in performance to antipodal BPSK, where the two symbols are 180° apart exhibiting a correlation factor of −1.

Figure 12:
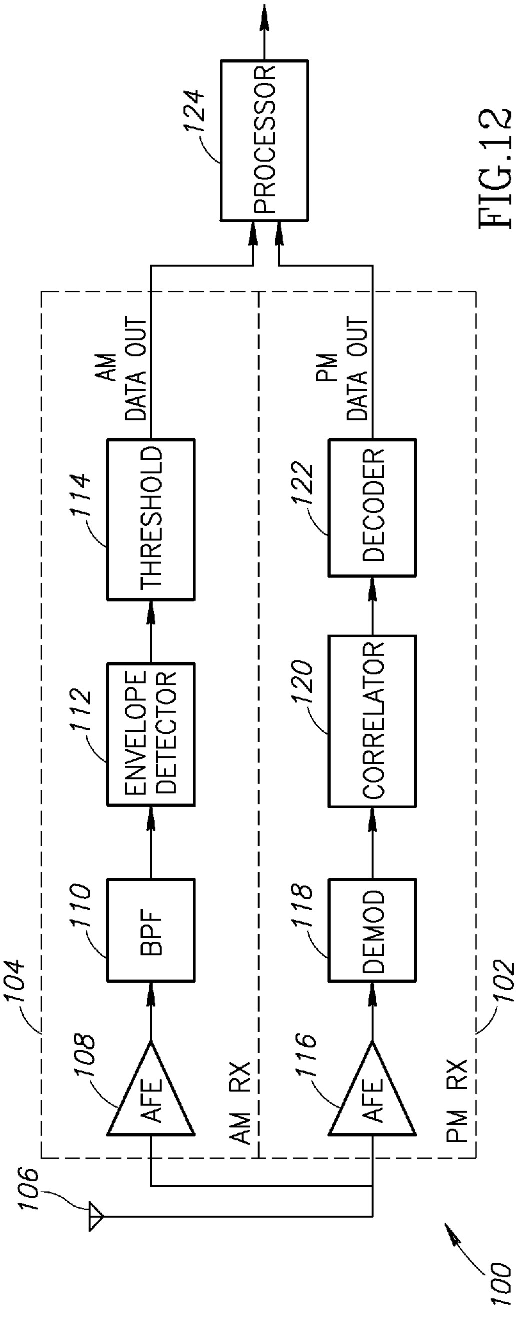
FIG. 12 is a diagram illustrating an example receiver incorporating both amplitude and phase modulation receiver paths.

A diagram illustrating an example receiver incorporating both amplitude and phase modulation receiver paths is shown in FIG. 12. In this example embodiment, the receiver is operative to receive both a legacy PWM/AM modulated broadcast signal as well as a phase modulated signal which is transmitted over the legacy PWM/AM signal. The receiver, generally referenced 100, comprises an AM receiver block 104 and a PM receiver block 102, both of which are connected to antenna 106 at their input and to processor 124 at their output.

Amplitude modulation receiver 104 comprises an envelope-detector-based receiver of the type that is typically used in consumer market RCC devices. The AM receiver 104 comprises band pass filter (e.g., crystal filter) 110, envelope detector 112 and threshold block 114. As shown in this block diagram, the AM signal is converted into an analog equivalent baseband signal by use of a conventional nonlinear envelope detector 112 (similar to the diode-based circuit in traditional AM receivers). A threshold operation 114 that follows serves to determine the middle level, around which the voltages below it would be converted to a logic low level and the voltages above it to a logic high level. The digital processing stage that follows this operation measures the pulse durations and accordingly recovers the symbols ('1', '0', or 'marker'). Note that, with such a receiver topology, an on-frequency interferer can cause the receiver to decode that symbol incorrectly. Typically, the effect of the interferer is greatest when the signal is at a "low". If the interferer is exactly on-frequency, however, then it has a very significant effect when it is out of phase and added to the high state of the transmitted signal (e.g., the WWVB signal).

In operation of a typical envelope detector based receiver, the modulated signal input to the receiver has two different amplitude levels with the information represented in the durations of each of these levels. The high/low decision is made by following the "low" and "high" levels with dedicated peak holders (with appropriate time-constants) and deriving the middle (average) of these two. A threshold operation (e.g., a simple comparator) is then used to create the logic level signals for the digital stage that follows where the pulse durations are measured and the '1'/'0'/'marker' symbol decision is made.

The phase modulation receiver 102 comprises a demodulator 118, correlator 120 and decoder 122. In one embodiment, the PM receiver 102 is operative to receive the signal broadcast from WWVB in Fort Collins, Colo. This broadcast signal adds phase modulation (PM) to the WWVB broadcast while maintaining the existing AM code, so as not to impact the existing time-of-day RCC devices.

Figure 13:
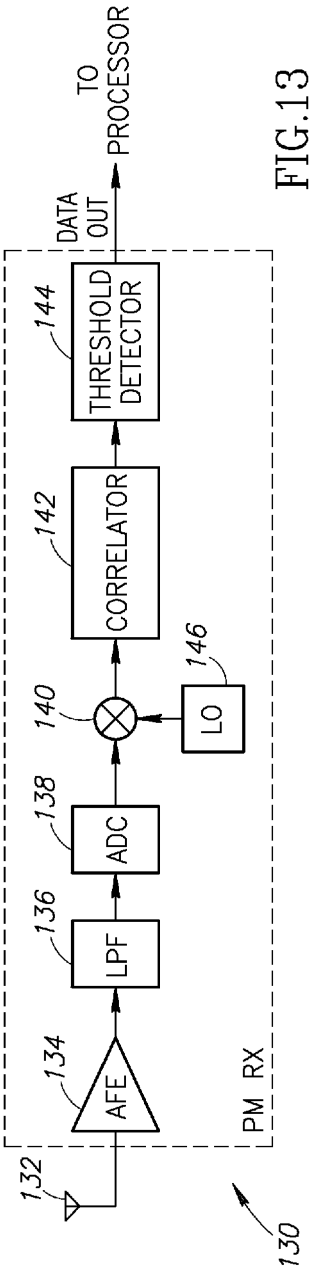
FIG. 13 is a diagram illustrating an example receiver adapted to receive a phase modulated signal.

A diagram illustrating an example receiver adapted to receive a phase modulated signal is shown in FIG. 13. In one embodiment, the receiver, generally referenced 130, comprises a coherent BPSK optimal receiver that may be implemented digitally. The PM receiver 130 comprises antenna 132 coupled to analog front end (AFE) 134, low pass filter (LPF) 136, analog to digital converter (ADC) 138, mixer 140, locally synthesized carrier (i.e. local oscillator (LO)) 146, correlator 142 and threshold detector 144. The filtering of the signal is based on the correlation operation which is followed by a decision that is made in the presence of AWGN.

The raw bit-error-rate (BER) performance of the PRK receiver, i.e. when disregarding error correction coding, for a signal to noise ratio $E_b/N_o$, is given by $$BER = Q\left(\sqrt{\frac{2 \cdot E_b}{N_o}}\right) \tag{2}$$

where $E_b$ is the energy per bit and $N_o$ is the noise density. The $E_b/N_o$ ratio is equivalent to the ratio between the power of the signal and the power of the noise in a bandwidth that is equal to the bit rate, i.e. $E_b/N_o$=SNR @ BW=$R_b$, where $R_b$ represents the bit rate. The threshold decision block 144 is where the decisions are made and the errors occur, in direct relation to the variance of noise, which is assumed here to have Gaussian nature and equal variances around the '0' and '1' symbols. The BER may also be expressed as a function of the distance between the symbols in the signal space, as follows $$BER = Q\left(\sqrt{\frac{d^2}{2 \cdot N_o}}\right) \tag{3}$$

where Q(x) is the tail probability of the normal distribution, i.e.

$$Q(x) = \frac{1}{\sqrt{2\pi}} \int_X^\infty \exp\left(-\frac{u^2}{2}\right) du \tag{4}$$

As previously noted, the analysis presented for the improvement obtained through the introduction of the phase modulation scheme assumed only the presence of AWGN in the receiver. In the presence of radio frequency interference (RFI), and particularly on-frequency interference, the performance improvement could be much more significant and stems from the structure of the BPSK receiver, where the demodulation is based on correlation.

Figure 14A:
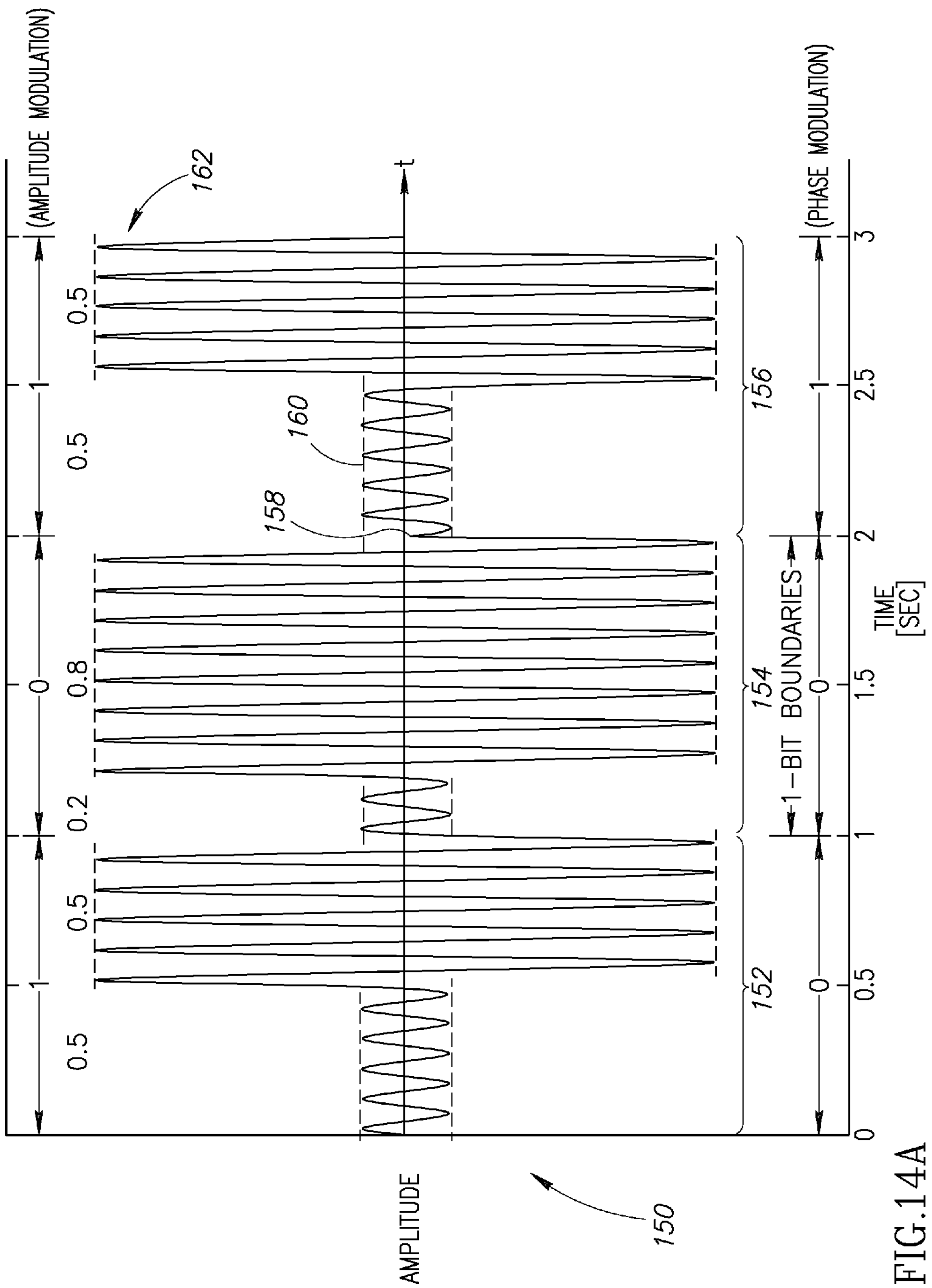
FIG. 14A is a diagram illustrating a first example waveform of phase modulation added to a pulse-width amplitude modulated carrier in an example communication protocol.

A diagram illustrating a first example phase modulation added to an amplitude modulated carrier in an example communication protocol is shown in FIG. 14A. The waveform illustrates three consecutive example bits in the transmission as a time-domain waveform 150. The three bits 152, 154 and 156 each span a duration of one second. Each of the one second bits is divided into a first portion 160 for which the carrier power is low and a second portion 162 for which the carrier power is high. In the legacy WWVB protocol, the information in each bit depends on the durations of these two portions with an even 0.5/0.5 sec partition representing a "1" bit, and the uneven 0.2/0.8 sec partition representing a "0" bit. A 0.8/0.2 sec partition represents a 'marker' bit, which may be used for timing identification, but does not carry information. The bits represented under the legacy PWM/AM modulation are indicated at the top portion of the diagram. For example, the three PWM/AM bits shown are "1", "0" and "1".

In accordance with an embodiment of the present invention, information is added to the existing modulation using BPSK modulation. A "1" is represented by a carrier having an inverted phase, with the phase inversion 158 occurring at the beginning of the bit, as shown for the third bit 156 at t=2 sec. It is noted that the phase inversion may also be performed at any other instance, e.g., during the low amplitude portion of the carrier if the receiver's phase demodulation operation is limited to the high-amplitude duration and disregards the low amplitude portion. While the information represented by the pulse widths is shown to be "1", "0", "1", the information that is sent in parallel, in accordance with the example BPSK (or PRK) protocol of the present invention, is shown to be "0", "0", "1" (as shown along the bottom portion of the diagram). Note that there is not necessarily any relationship between the bit pattern transmitted using PWM/AM and that transmitted using PM as they can be completely independent. It is noted that the carrier frequency is not shown to scale in the figure to enhance clarity, but it is preferable for the phase transitions to occur at zero crossing instances of the carrier, as shown in the figure.

Figure 14B:
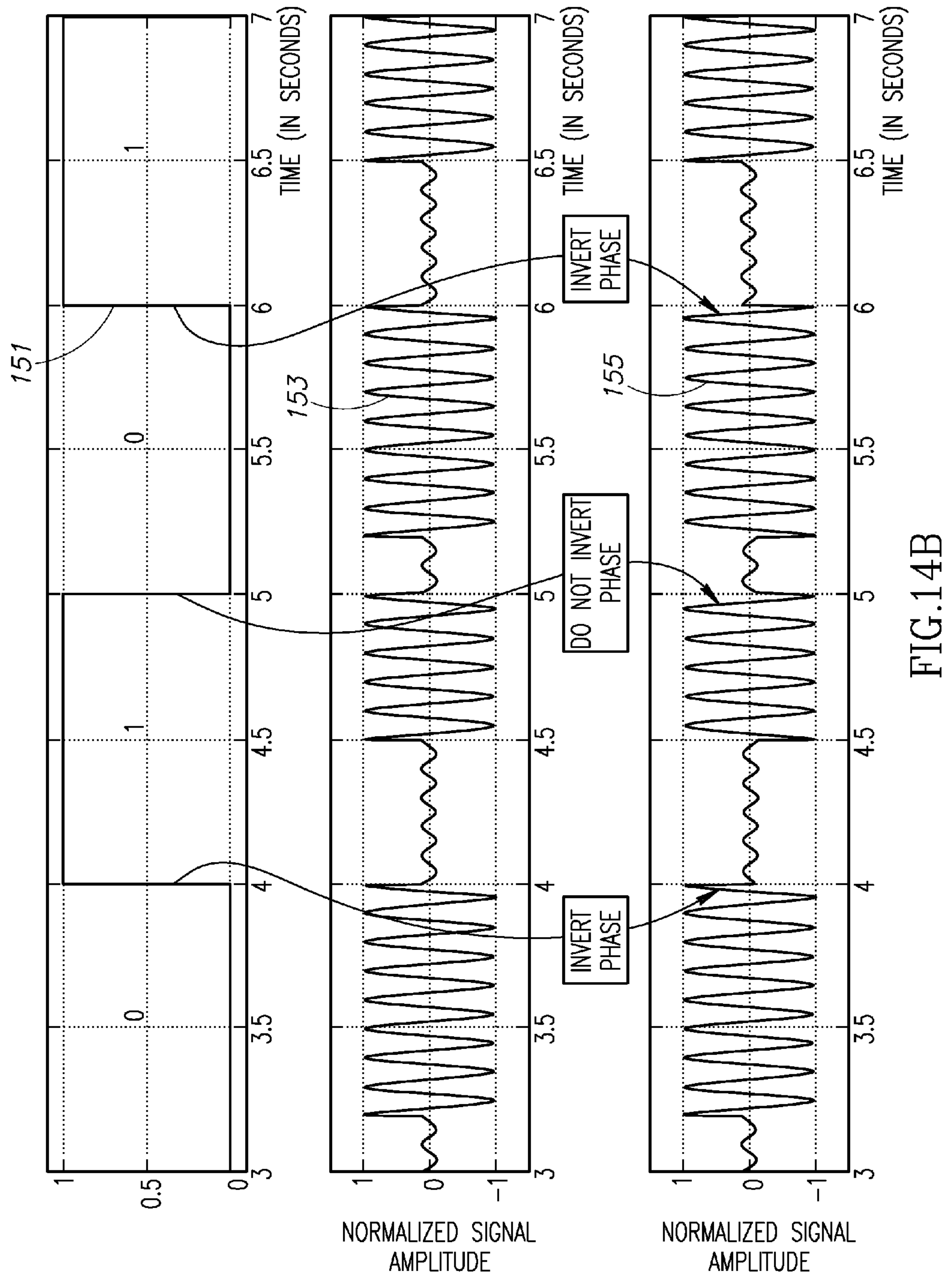
FIG. 14B is a diagram illustrating a second example waveform of phase modulation added to a pulse-width amplitude modulated carrier in an example communication protocol.

A diagram illustrating a second example phase modulation added to an amplitude modulated carrier in an example communication protocol is shown in FIG. 14B. The waveform illustrates four consecutive example bits in the transmission as the actual time-domain bit stream waveform 151. The four bits '0', '1', '0', '1' each span a duration of one second. Each of the one second bits is divided into a first portion for which the carrier power is low and a second portion for which the carrier power is high. The legacy PWM/AM modulation bits are shown as the transmitted ASK waveform 153. Waveform 155 shows the combined phase modulation over amplitude modulation (PSK over PWM/ASK). For example, phase reversals can be seen in the two '0' to '1' bit transitions.

Figure 15:
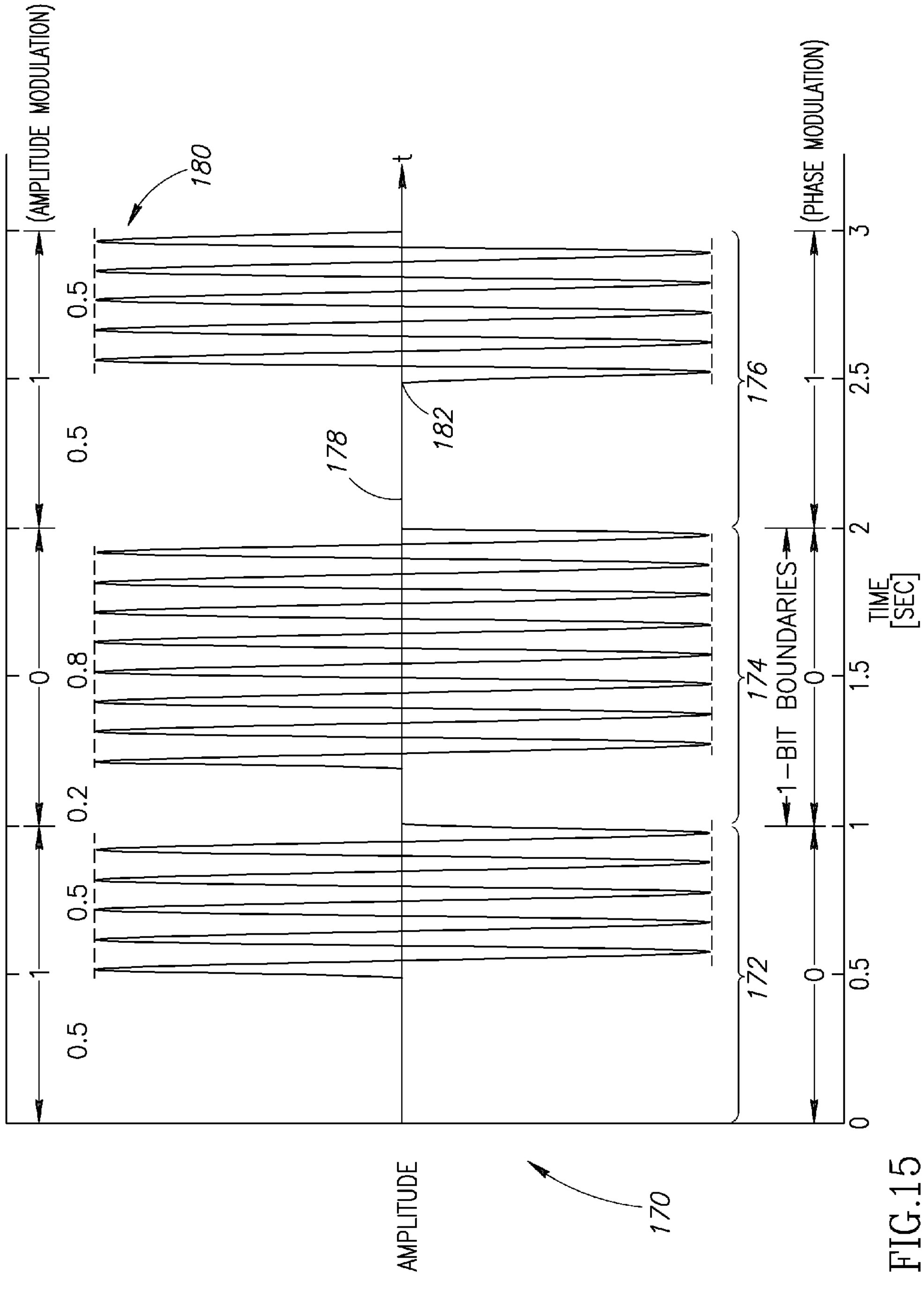
FIG. 15 is a diagram illustrating a third example phase modulation added to a pulse-width amplitude modulated carrier in an example communication protocol.

A diagram illustrating a third example phase modulation added to an amplitude modulated carrier in an example communication protocol is shown in FIG. 15. In this third example, the carrier amplitude transmitted during the low portions of a bit is zero rather than reduced to a lower value (e.g., −17 dB or 0.14 amplitude level) as is the case in FIG. 14A. As in FIG. 14A, the waveform illustrates three consecutive example bits in the transmission as a time-domain waveform 170. The three bits 172, 174 and 176 each span a duration of one second. Each of the one second bits is divided into a first portion 178 for which the carrier power is zero and a second portion 180 for which the carrier power is high.

In accordance with the present invention, the modulation of information is added to the existing modulation using BPSK modulation. A "1" is represented by a carrier having an inverted phase, with the phase inversion 182 occurring at the beginning of the bit as shown for the third bit 176 at t=2.5 sec. While the information represented by the pulse widths is shown to be "1", "0", "1", the information that is sent in parallel, in accordance with the BPSK (or PRK) protocol of the present invention, is shown to be "0", "0", "1" (as shown along the bottom portion of the diagram).

Note that there is not necessarily any relationship between the bit pattern transmitted using PWM/AM and that transmitted using PM as they can be completely independent. It is noted that the carrier frequency is not shown to scale in the figure to enhance clarity, but it is preferable for the phase transitions to occur at zero crossing instances of the carrier.

Figure 16:
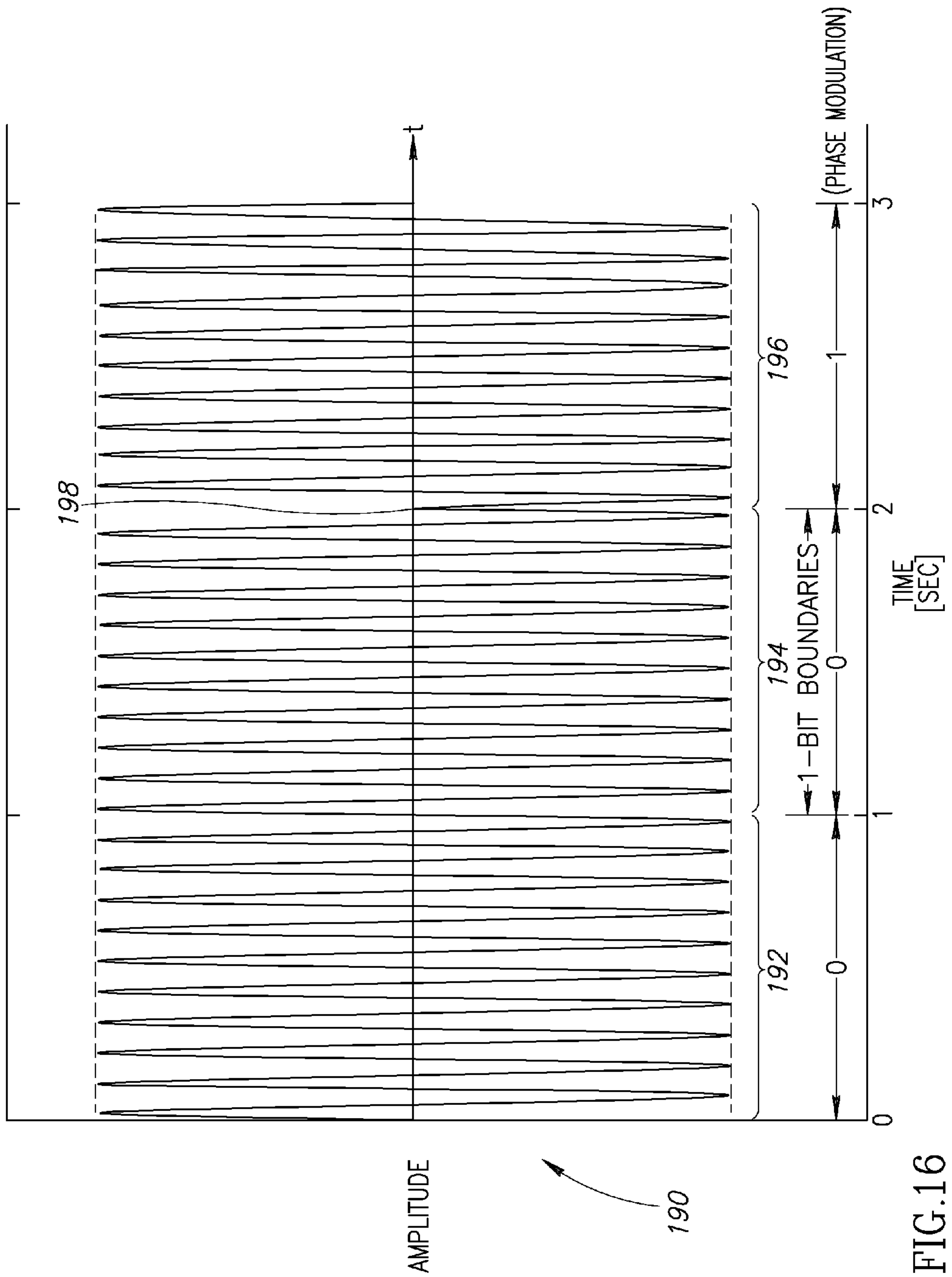
FIG. 16 is a diagram illustrating an example phase modulated carrier in an example communication protocol.

A diagram illustrating an example phase modulated carrier in an example communication protocol is shown in FIG. 16. In this third example, the phase modulation is not added to a PWM/AM signal but rather is sent as the entire bit duration. The waveform illustrates three consecutive example bits in the transmission as a time-domain waveform 190. The three bits 192, 194 and 196 each span a duration of one second. During each of the bits the carrier power is high. The modulation of information is performed using BPSK (or PRK) modulation, in accordance with an embodiment of the present invention. A "1" is represented by a carrier having an inverted phase, with the phase inversion 198 occurring at the beginning of the bit, as shown for the third bit 196 at t=2 sec. The information sent in accordance with the BPSK protocol of the present invention is shown to be "0", "0", "1" (as shown along the bottom portion of the diagram). It is noted that the carrier frequency is not shown to scale in the figure to enhance clarity, but it is preferable for the phase transitions to occur at zero crossing instances of the carrier, as may be implemented easily when a bit spans an integer number of carrier cycles, as is the case for WWVB, where the carrier frequency is 60 kHz (i.e. 60,000 cycles per bit).

The diagrams in FIGS. 14A and 14B describe the amplitude/pulse-width modulation used in the historical WWVB broadcast, as well as the phase-modulation introduced in accordance with the present invention. It is noted that the enhancement in the communication protocol offered by the present invention, in the form of independently defined phase modulation and the use of a known synchronization sequence, is not limited to the broadcast of WWVB and may be applied worldwide, where similar AM/pulse-width schemes are used or where no AM/pulse-width modulation needs to be supported, allowing for continuous BPSK to be used.

Note that the term phase modulation may denote either (1) phase modulation over (combined with) the historical amplitude/pulse-width modulation or (2) pure phase modulation alone. Note also that the data fields assigned to each bit in the frame for both amplitude and phase modulation are essentially completely independent.

The phase modulation added to the amplitude modulation may comprise any suitable type of phase modulation including, for example, BPSK, DBPSK, PRK, angle modulation, PM, MSK, FSK, etc. In addition, the underlying amplitude modulation may comprise any type of amplitude modulation, including for example, ASK, AM, SSB, QAM, pulse position modulation (PPM), pulse width modulation (PWM), OOK, ASK, etc.

While the broadcast signal is also amplitude-modulated, with the amplitude modulation either representing the exact same time information as is represented in the phase modulation, overlapping information, or other information, the receiver constructed in accordance with an embodiment of the invention only demodulates the phase and does not extract information from the amplitude modulation.

In another embodiment of the invention, the amplitude modulation on the signal is also demodulated by the receiver, and overlap between data that is available both in the amplitude and phase modulation can be exploited to strengthen the reliability of the recovered data.

In another embodiment of the invention, a receiver only extracts the timing from the phase-modulation in the received broadcast, while the time information that is phase-modulated is ignored.

Alternatively, in another embodiment of the invention, only the time-information is extracted from the phase-modulation in the received broadcast while the timing, which is necessary to read the time information, is obtained through the demodulation of the amplitude modulation that is present in the broadcast, through the identification of one or more markers or other known portions of the amplitude modulated frame.

Alternatively, in another embodiment of the invention, the time-information is extracted from the amplitude-modulation in the received broadcast while the timing, which is necessary to read the time information, is obtained through the demodulation of the phase modulation that is present in the broadcast.

Figure 17:
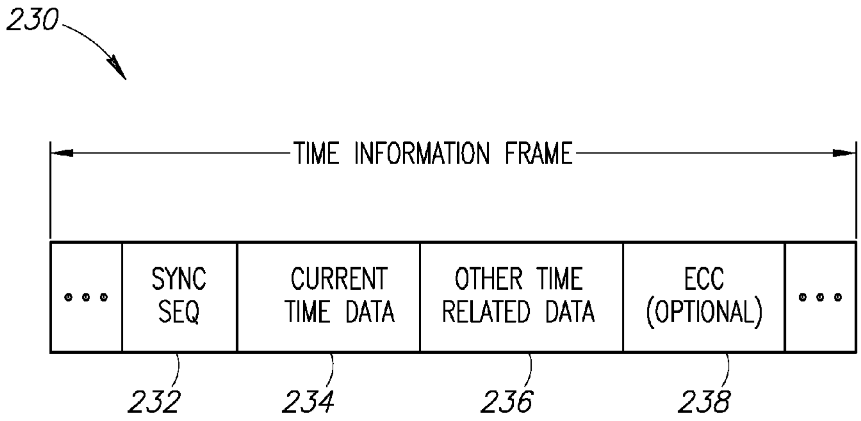
FIG. 17 is a diagram illustrating a first example time information frame structure incorporating timing, time and additional information.

A diagram illustrating a first example time information frame structure incorporating timing, time and additional information is shown in FIG. 17. The time information frame, generally referenced 230, comprises a synchronization sequence field 232, a current time data field 234, other time related data field 236 and optional error correction code (ECC) field 238. In one embodiment, each time information frame spans 60 seconds. Frames having other durations are possible as well and may require a different approach for the representation of minute boundaries and/or the seconds.

The synchronization sequence field 232 comprises a known synchronization sequence (e.g., barker code, modified barker code, pseudo random sequence, or any other known word or bit/symbol sequence) at a known timing within the one minute time information frame of 60 bits that is transmitted every 60 seconds. Note that in alternative embodiments the synchronization sequence may be placed within a frame N such that it overlaps or straddles the frame N−1 before it or frame N+1 after it.

The current time data field 234 may consist of a merged date and time of day field or may be broken down into individual sub-fields used to indicate date, year, hours, minutes, etc. The other time related data field 236 may include zero or more fields used to indicate, e.g., daylight savings time start, leap second information, etc.

Figure 18:
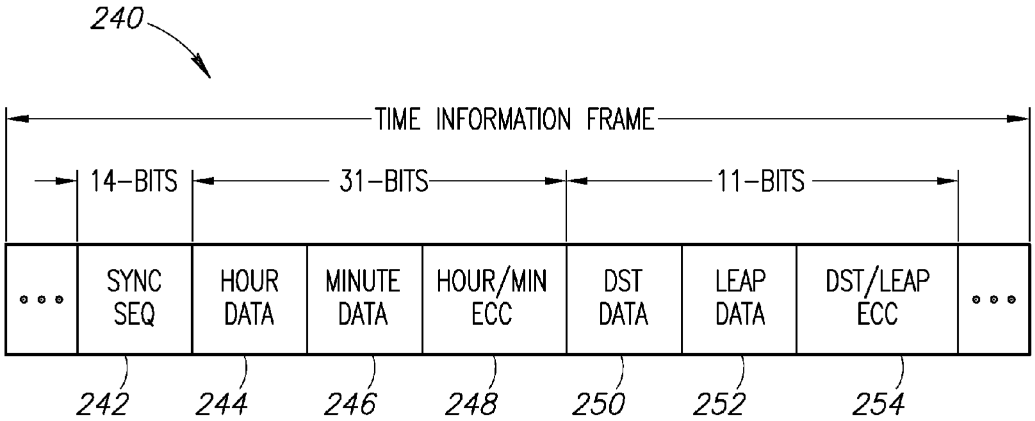
FIG. 18 is a diagram illustrating a second example time information frame structure incorporating timing, time and additional information.

A diagram illustrating a second example time information frame structure incorporating timing, time and additional information is shown in FIG. 18. The time information frame, generally referenced 240, comprises a synchronization sequence field 242, an hour data field 244, minute data field 246, optional hour/minute ECC field 248, daylight savings time (DST) data field 250, leap second data field 252 and DST/leap second ECC field 254. In one example, the synchronization sequence field 242 spans 14-bits; the combined hour data field 244, minute data field 246 and hour/minute ECC field 248 span 31-bits in a merged time data field; and the DST data field 250, leap second field 252 and DST/leap second ECC field 254 comprising an additional information field, spans 11-bits in total.

Figure 19:
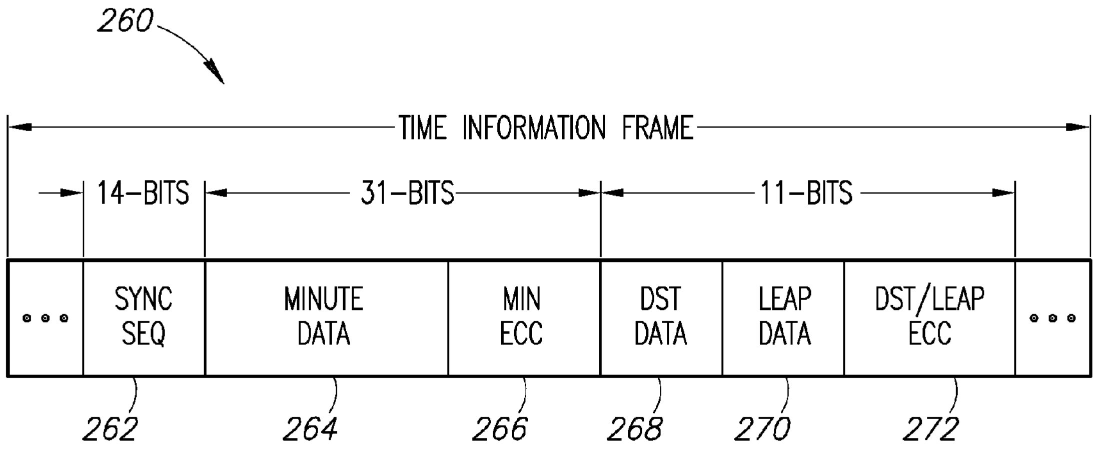
FIG. 19 is a diagram illustrating a third example time information frame structure incorporating timing, time and additional information.

A diagram illustrating a third example time information frame structure incorporating timing, time and additional information is shown in FIG. 19. The time information frame, generally referenced 260, comprises a synchronization sequence field 262, a minute data field 264, optional minute ECC field 266, daylight savings time (DST) data field 268, leap second data field 270 and DST/leap second ECC field 272. In one example, the synchronization sequence field 262 spans 14-bits; the minute data field 264 and minute ECC field 266 span 31-bits in a merged time data field; and the DST data field 268, leap second field 270 and DST/leap second ECC field 272 comprising an additional information field, spans 11-bits in total.

In the above two versions of the time information frame, the synchronization sequence comprises a 14-bit known sequence. The receivers use this sequence to acquire initial synchronization such as when first powering on. Receivers also use the sequence to track the synchronization timing signal broadcast in the frames in order to adjust their internal timekeeping to maintain synchronization with the broadcast signal.

Figure 20:
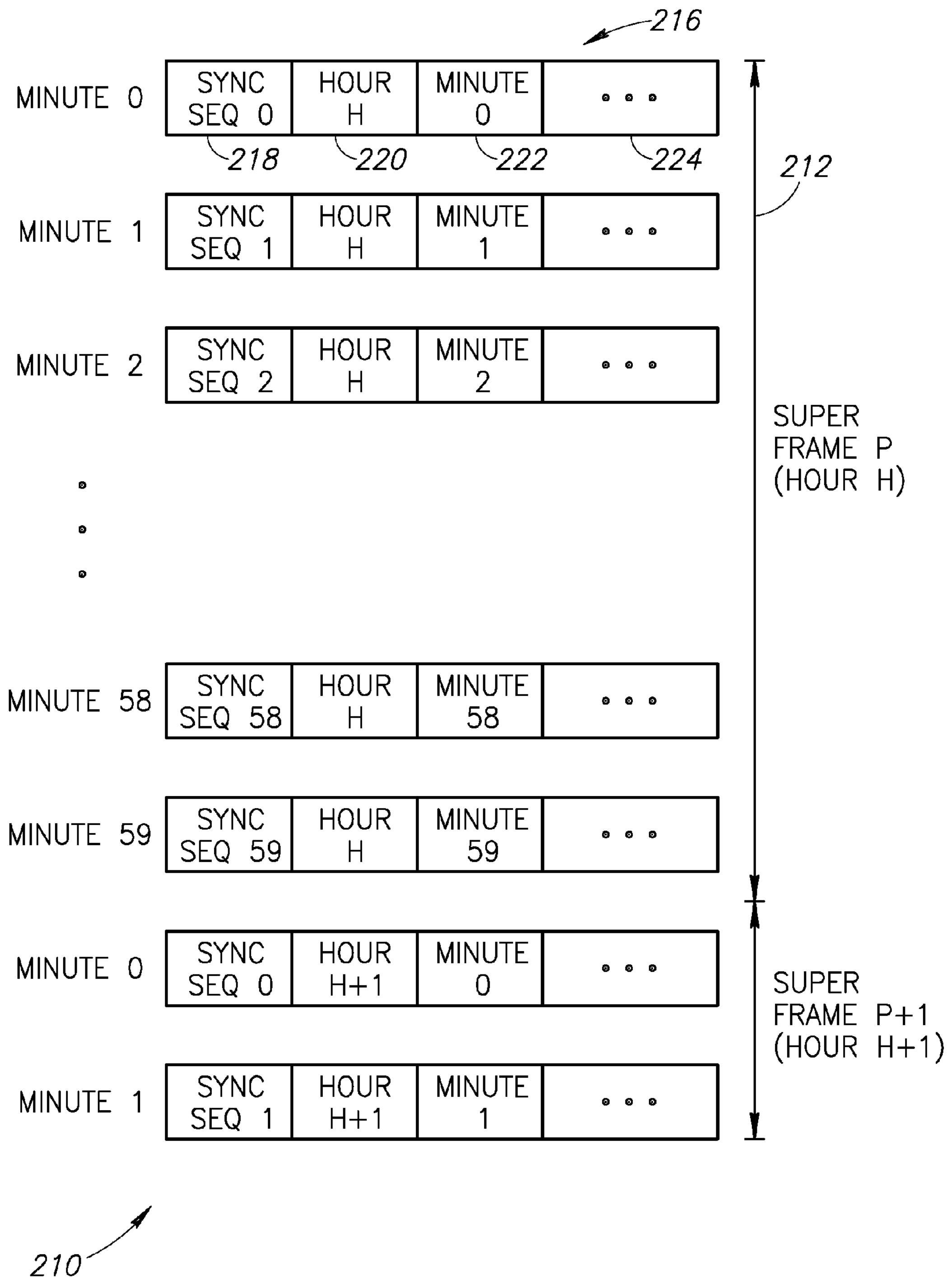
FIG. 20 is a diagram illustrating the structure of an example super-frame incorporating timing and time information.

A diagram illustrating the structure of an example super frame incorporating timing and time information is shown in FIG. 20. In an alternative embodiment, information is recovered not only from the bits of a frame, but may also be recovered by using multiple consecutive frames making up a superframe. In this embodiment, additional information may be conveyed using the superframe, or the same information from each frame may be repeated to allow for improved reception based on the accumulated energy of multiple frames.

The use of superframes can potentially improve performance of the receiver by nearly two orders of magnitude, which may be critical in low SINR conditions. In one embodiment, the polarity of each of the one-minute frames in an hour is modulated (e.g., differentially or otherwise) by a corresponding bit in a 60-bit hour-synchronization sequence. The preserved consistency between the polarities of the synchronization sequence and the information in each of one-minute frames permits the receiver to resolve the 180-degree phase ambiguity of BPSK reception.

By correlating against multiple consecutive synchronization sequences, the receiver can accurately adjust its timing and can then use recorded data from an entire hour to perform long-term integration for the hour field (i.e. soft addition). This provides an improvement in gain of 60 (i.e. 18 d B), which enables operation at SNIR values well below 0 dB (when evaluated in a 1 Hz bandwidth). While the minute and parity fields for the time information vary from one minute to the next in the course of an hour, all other fields, however, remain fixed. Thus, simple addition can be used to increase the total amount of energy involved in the information recovery. Since the pattern according to which the minute frame is changing is also known, it too can serve in the extended reception operation. The receiver may determine its timing with respect to the beginning of an hour based on the identification of a portion of the superframe-synchronization sequence with or without recovering information from the minute fields in the received frames.

With reference to FIG. 20, a frame 216 comprises a synchronization sequence field 218, hour field 220, minute field 222 and zero or more additional fields 224. A superframe (e.g., superframe P 212) is defined as a set of multiple frames (e.g., 60 frames) wherein the phase of one or more fields in each frame may be modulated to convey information on a superframe basis. For example, additional timing information can be conveyed by modulating the phase of the synchronization sequence field to define a super-synchronization sequence. Each synchronization sequence (i.e. sync seq 0, sync seq 1, . . . , sync seq 59) is assigned a particular phase wherein the pattern is known to all receivers. The receivers use their knowledge of the super-synchronization sequence to aid in adjusting their time to a particular minute within the hour without having to recover the information from the minute field. Such a super-synchronization sequence provides additional information for receivers to aid in acquisition and tracking at low SINR conditions.

The use of superframes provides system scalability in that it allows for receivers experiencing different reception conditions to use the received signal differently. In particular, superframes (or the use of a number of multiple frames) allow for the accumulation of received energy over multiple one-minute frames to provide for a corresponding gain in the receiver. For example, reception for an entire hour may provide a gain of 60 or 18 dB with respect to reception over a single minute (i.e. a single frame).

The terminology used herein is for the purpose of describing particular embodiments only and is not intended to be limiting of the invention. As used herein, the singular forms “a”, “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A radio receiver method, said method comprising:

receiving broadcast signal data frames comprising phase modulation (PM) over a legacy amplitude modulated (AM) signal, said broadcast signal transmitted as ‘0’ and ‘1’ bits encoded with time information separate from timing information, said timing information based on a known synchronization sequence spanning multiple seconds beginning at a known point within each data frame;

extracting said time and timing information from the phase of said received signal;

wherein said phase modulation comprises discontinuous binary phase shift keying (BPSK) modulation, wherein carrier amplitude transmitted during low portions of a bit is zero;

wherein information represented by said phase modulation is independent of information represented by said legacy amplitude modulation;

wherein said ‘0’ bit is represented by said legacy amplitude modulated signal transmitted without a phase inversion; and wherein said ‘1’ bit is represented by said legacy amplitude modulated signal transmitted with a 180 degree phase inversion.

2. The method according to claim 1, wherein said legacy amplitude modulation comprises pulse width modulation (PWM)/amplitude shift keying (ASK) modulation scheme.

3. The method according to claim 2, wherein extracting said time information comprises limiting phase demodulation to the last 0.5 second of each bit of said legacy PWM/ASK modulation scheme.

4. The method according to claim 2, wherein extracting said time information comprises limiting phase demodulation to those portions of each bit that are at high amplitude in accordance with said legacy PWM/ASK modulation scheme.

5. The method according to claim 2, wherein extracting said time information comprises performing phase demodulation on the low-amplitude as well as high-amplitude portions of each bit of said legacy PWM/ASK modulation scheme.

6. A radio receiver, comprising:

a receiver circuit operative to receive broadcast signal data frames comprising phase modulation (PM) over a legacy amplitude modulated (AM) signal, said broadcast signal transmitted as '0' and '1' bits encoded with time information separate from timing information, said timing information based on a known synchronization sequence spanning multiple seconds beginning at a known point within each data frame;

a circuit operative to extract said time and timing information from the phase modulated portion of said received signal;

wherein said phase modulation comprises discontinuous binary phase shift keying (BPSK) modulation, wherein carrier amplitude transmitted during low portions of a bit is zero;

wherein information represented by said phase modulation is independent of information represented by said legacy amplitude modulation;

wherein said '0' bit is represented by said legacy amplitude modulated signal transmitted without a phase inversion; and wherein said '1' bit is represented by said legacy amplitude modulated signal transmitted with a 180 degree phase inversion.

7. The receiver according to claim 6, wherein said legacy amplitude modulation comprises pulse width modulation (PWM)/amplitude shift keying (ASK) modulation scheme.

8. The receiver according to claim 7, wherein extracting said time information comprises limiting phase demodulation to the last 0.5 second of each bit of said legacy PWM/ASK modulation scheme.

9. The receiver according to claim 7, wherein extracting said time information comprises limiting phase demodulation to those portions of each bit that are at high amplitude in accordance with said legacy PWM/ASK modulation scheme.

10. The receiver according to claim 7, wherein extracting said time information comprises performing phase demodulation on the low as well as high amplitude portions of each bit of said legacy PWM/ASK modulation scheme.

11. A radio receiver method, said method comprising:

receiving phase modulated (PM) broadcast signal data frames encoded with time information separate from timing information, wherein said phase modulation is applied over a legacy pulse-width modulated (PWM)/amplitude modulation (AM) signal and transmitted as '0' and '1' bits, said timing information based on a known barker code transmitted at a predictable point in each data frame;

extracting said time and timing information from the phase modulation of said received signal;

accumulating received energy over multiple broadcast signal data frames thereby providing a corresponding gain in reception;

wherein information represented by said phase modulation is independent of information represented by said legacy pulse-width modulated (PWM)/amplitude modulation (AM); and wherein said '0' bit is represented by said legacy amplitude modulated signal transmitted without a phase inversion and wherein said '1' bit is represented by said legacy amplitude modulated signal transmitted with a 180 degree phase inversion, whereby the Euclidean distance between the '0' and '1' phase modulated waveforms is increased over that of the '0' and '1' legacy amplitude modulated waveforms thereby improving the performance of said radio receiver.

12. The method according to claim 11, wherein extracting said time information comprises limiting phase demodulation to the last 0.5 second of each bit of said legacy PWM/ASK modulation scheme.

13. The method according to claim 11, wherein extracting said time information comprises limiting phase demodulation to those portions of each bit that are at high amplitude in accordance with said legacy PWM/ASK modulation scheme.

14. The method according to claim 11, wherein extracting said time information comprises performing phase demodulation on the low as well as high amplitude portions of each bit of said legacy PWM/ASK modulation scheme.

15. The method according to claim 11, further comprising receiving superframes consisting of a plurality of frames used to extract timing information.

16. A radio receiver, comprising:

a receiver circuit operative to receive phase modulated (PM) broadcast signal data frames encoded with time information separate from timing information, wherein said phase modulation is applied over a legacy pulse-width modulated (PWM)/amplitude modulation (AM) signal and transmitted as '0' and '1' bits, said timing information based on a known barker code transmitted at a predictable point in each data frame;

said receiver circuit further operative to accumulate received energy over multiple broadcast signal data frames thereby providing a corresponding gain in reception;

a circuit operative to extract said time and timing information from the phase modulated portion of said received signal;

wherein information represented by said phase modulation is independent of information represented by said legacy pulse-width modulated (PWM/amplitude modulation (AM); and wherein said '0' bit is represented by said legacy amplitude modulated signal transmitted without a phase inversion and wherein said '1' bit is represented by said legacy amplitude modulated signal transmitted with a 180 degree phase inversion, whereby the Euclidean distance between the '0' and '1' phase modulated waveforms is increased over that of the '0' and '1' legacy amplitude modulated waveforms thereby improving the performance of said radio receiver.

17. The receiver according to claim 16, wherein extracting said time information comprises limiting phase demodulation to the last 0.5 second of each bit of said legacy PWM/ASK modulation scheme.

18. The receiver according to claim 16, wherein extracting said time information comprises limiting phase demodulation to those portions of each bit that are at high amplitude in accordance with said legacy PWM/ASK modulation scheme.

19. The receiver according to claim 16, wherein extracting said time information comprises performing phase demodulation on the low as well as high amplitude portions of each bit of said legacy PWM/ASK modulation scheme.

20. The receiver according to claim 16, wherein said receiver circuit is further operative to receive superframes consisting of multiple frames used to extract timing information.

21. The receiver according to claim 16, wherein said receiver circuit is further operative to:

demodulate the amplitude modulation in the received broadcast in addition to the phase modulation therein; and utilizing information represented by the amplitude to either add information that has not been recovered from the receiver's phase demodulation operation or to confirm it.

* * * * *